United States Patent [19]

Pascucci

[11] Patent Number: 5,347,493
[45] Date of Patent: Sep. 13, 1994

[54] ROW DECODER FOR NAND-TYPE ROM

[75] Inventor: Luigi Pascucci, Giovanni, Italy

[73] Assignee: SGS-Thomson Microelectronics, S.r.l., Agrate Brianza, Italy

[21] Appl. No.: 938,731

[22] Filed: Aug. 31, 1992

[30] Foreign Application Priority Data

Aug. 30, 1991 [IT] Italy ................................. 91A0027

[51] Int. Cl.$^5$ .............................................. G11C 8/00
[52] U.S. Cl. .......................... 365/230.06; 365/230.03; 365/230.08; 365/230.05; 365/94
[58] Field of Search ...................... 365/230.06, 230.03, 365/230.08, 231, 230.05, 94

[56] References Cited

U.S. PATENT DOCUMENTS 4,849,943  7/1989  Pfennings ........................ 365/230.06
5,241,511  8/1993  Hsueh ............................. 365/230.06

OTHER PUBLICATIONS

Cuppens, et al., "A 256 Kbit ROM with Serial ROM Cell Structure", IEEE Journal of Solid State Cir., vol. SC-18, #3, Jun. '83 pp. 340–344.

Momodomi, et al., "A 4–Mb NAND EEPROM with Tight Programmed $V_t$ Distribution", IEEE J. SSC., vol. 26, #4, Apr. '1991, pp. 492–496.

Primary Examiner—Eugene R. LaRoche
Assistant Examiner—Huan Hoang
Attorney, Agent, or Firm—Robert Groover

[57] ABSTRACT

A decoder for a ROM matrix organized in selectable NAND parcels of cells utilizes four selection circuits driven through five buses for implementing a two-level decoding, thus driving less than all of the rows through a plurality of selectable drivers. The architecture of the row decoder, based on a subdivision into a plurality of row drivers renders the circuitry physically compatible with the geometrical constraints imposed by a particularly small pitch of the cells. Subdivision of row drivers has positive effects also on access time, reliability and overall performance of the memory as compared to a memory provided with a decoder of the prior art driving in parallel all the homonymous rows of all the selectable NAND parcels of cells.

20 Claims, 2 Drawing Sheets

ROW DECODER FOR NAND-TYPE ROM

BACKGROUND AND SUMMARY OF THE INVENTION

The present invention relates to memory architectures, and particularly to the architecture of a row decoder for a so-called NAND-type ROM (Read Only Memory).[1]

[1] See Cuppens et al., "A 256 kbit ROM with Serial ROM Cell Structure," 18 IEEE JOURNAL OF SOLID-STATE CIRCUITS 340ff (June 1983); Kawagoe et al., "Minimum size ROM structure compatible with silicon-gate E/D MOS LSI,"11 IEEE JOURNAL OF SOLID-STATE CIRCUITS 360ff (June 1976); Momodori et al., "A 4-Mb NAND EEPROM with Tight [sic] Programmed $V_t$ Distributions," 26 IEEE JOURNAL OF SOLID-STATE CIRCUITS 492ff (April 1991); and U.S. Pat. Nos. 4,059,826, 4,142,176, 4,344,005, 4,419,741, 4,423,432, 4,480,320, 4,489,400, 4,565,712, 4,570,239, 4,646,265, 4,980,861, and 5,060,190; all of which are hereby incorporated by reference.

NAND-type ROMs use an architecture where all cells along a single column position are connected in series. Nonswitching cells (e.g. cells programmed to "1") are permanently ON, and other cells ("0" cells) turn on or off depending on the signal applied by a row line. Thus, to sense a particular row, the transistors of all other rows are turned on. Current will pass the bitline, and pull up a sensed node at the sense amplifier, only if all cells in the column are turned on. Since the cells of all other rows are certain to be on, the current signal seen at the sense amplifier (for any given column) will depend on the ON or OFF state of the cell in the selected row, in that column.[2]

[2] In practice, the number of cells in series is limited, to avoid speed degradation due to the on-state series resistance of the transistors in the nonselected rows.

The advantage of this configuration is increased density, since no contacts are needed in the array. However, a different decoding architecture is needed. Moreover, a contactless array can impose tight constraints on the geometry of peripheral circuits.

One of the most difficult problems to be overcome when designing a ROM array, wherein memory cells are physically arranged in a matrix of rows and columns and are organized in a plurality of selectable NAND parcels of cells, is represented by the implementation of a decoder which will be compatible with the physical ordering "pitch" (i.e. the very small distance between adjacent rows of memory cells).

Moreover, for a matrix of cells organized in a NAND configuration, the decoding is necessarily a two-level decoding. This requires the decoder to be capable of driving in parallel all homonymous rows of all the NAND parcels of cells. This "second-level" decoding circuitry, suitably buffered, is rather large and cumbersome and therefore must necessarily be located in a "dedicated" area, normally at the top or at the bottom of the area occupied by the matrix of cells.

By contrast, a dedicated "select-line" decoding circuitry (first-level decoding) is usually placed at the beginning of each selection line (at least one for each NAND parcel of cells) and is reserved exclusively for the selection of the so-called select-lines.

If the memory matrix includes a large number of NAND parcels of cells (as in large memories, e.g. 128 parcels for a megabit memory), the load of the drivers of the single decoder for homonymous rows of all the NAND parcels is very large, and therefore the switching time becomes rather long. An excessively long wordline selection time of the memory has a negative influence on the access time of the memory device.

Moreover, the simultaneous switching of so many wordlines increases the power consumption, due to capacitive charging and discharging. This power consumption becomes larger the higher is the operating frequency of the memory device.

In addition, the switching of very large capacitances may cause non-negligible fluctuations on the supply rails $V_{CC}$ and $V_{SS}$ (ground), as well as inducing noise in sensitive circuits, such as for example sense amplifiers, reference systems, input circuits and the like. This worsens the overall performance of the device.

The disclosed innovations provide a decoder for NAND-type ROM devices which is compatible with a very small cell pitch of NAND-configured memory architectures, and which at the same time would permit to implement independent driving circuit for less than all of wordlines (rows) of the memory matrix, in order to avoid a drop of performance due to the above-identified effects of known row decoders utilized in this type of memory devices, is fulfilled by the present invention.

The decoder architecture provided by the present invention has an architecture based on four distinct selectors for implementing the required two-level decoding. These four selectors are driven through five distinct multiwire buses, coming from a pre-decoding circuitry, in accordance with common techniques which are well known to any skilled technician. In particular, a first block-selector is driven through two of said buses.

BRIEF DESCRIPTION OF THE DRAWING

The present invention will be described with reference to the accompanying drawings, which show important sample embodiments of the invention and which are incorporated in the specification hereof by reference, wherein.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
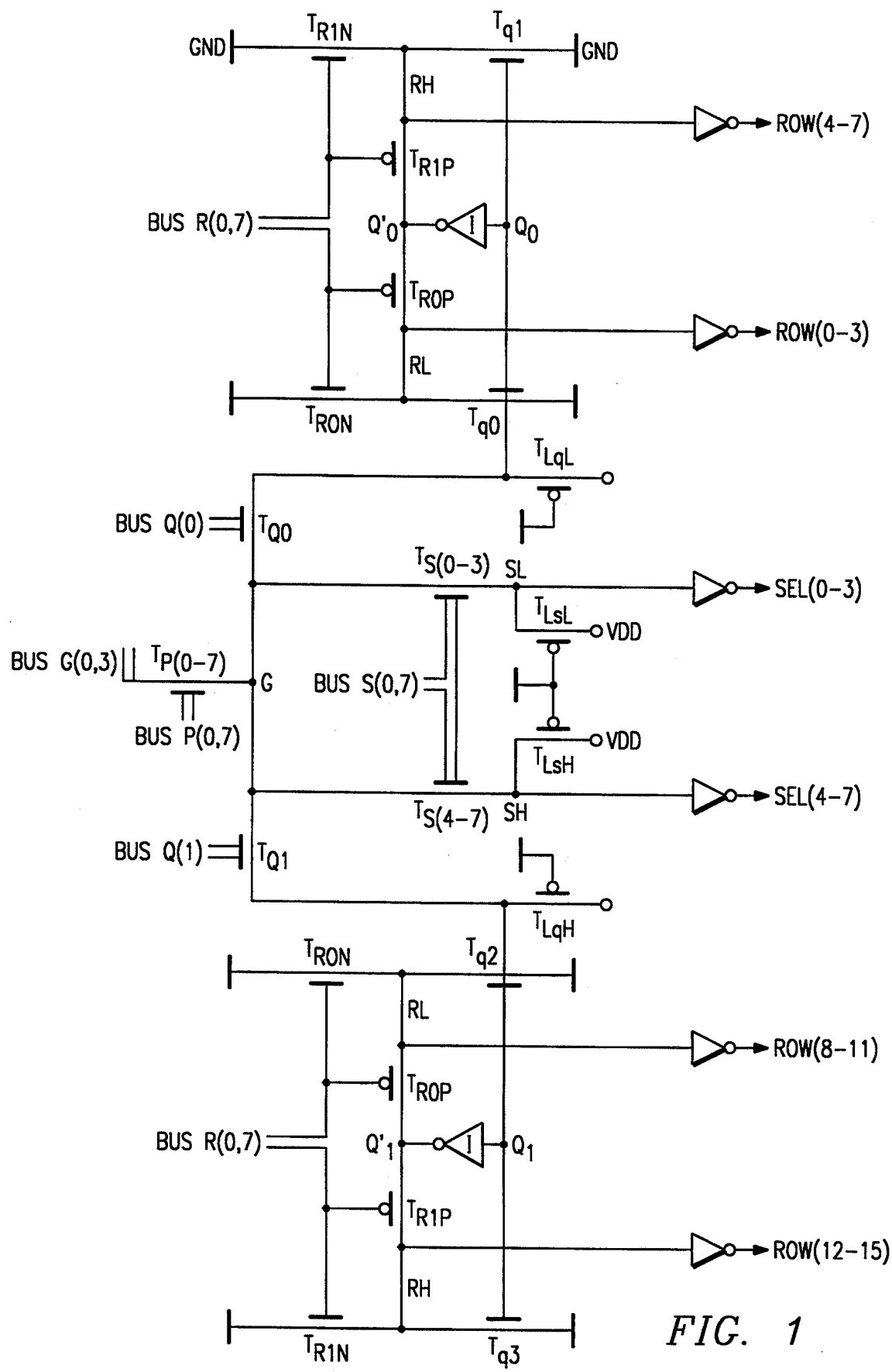
FIG. 1 is a schematic partial illustration of a row decoder for a NAND-type ROM, made in accordance with the present invention.

FIG. 1 is a schematic partial illustration of a row decoder for a NAND-type ROM, made in accordance with the present invention. For compactness, this Figure is highly condensed. As will be readily apparent to those skilled in the art, multiple paralleled wires (or transistors) are frequently represented by a single wire (or device), with an indication of repetition. For example, only two of the eight select lines (SEL 0–7) are shown. (These select lines are controlled through an eight-wire S bus. Each of these select lines selects a "parcel" of 16 rows of memory cells.)

Similarly, only four lines of the sixteen $ROW_n$ lines are shown. These lines drive (in second-level decoding) individual row buffers for selecting an addressed row of the memory, and are controlled by an eight-wire R bus and a two-wire Q bus.

The signals on all of the control buses are generated by a conventional predecode circuit (not shown in the figures) from the incoming address signals. In the embodiment depicted in FIG. 1, the signals on the control busses may have the following characteristics:

| G-BUS | ACTIVE "0" (1 line) | DON'T "1" (3 lines) | STAND-BY "1" (4 lines) |
|---|---|---|---|
| P-BUS | ACTIVE "1" (1 line) | DON'T "0" (7 lines) | NO CONDITION |
| Q-BUS | ACTIVE "1" (1 line) | DON'T "0" (1 lines) | NO CONDITION |
| R-BUS | ACTIVE "0" (1 line) | DON'T "1" (7 lines) | NO CONDITION |
| S-BUS | ACTIVE "1" (1 line) | DON'T "0" (7 lines) | NO CONDITION |

The decoder depicted in FIG. 1 operates as follows. Generally, when a certain block of memory cells of the matrix is not selected, the relative control signal coming from the G bus is in a DON'T "1" state. Under these conditions, the G node of the circuit, which represents a virtual ground node, is in a "high" state (1), i.e. the voltage $V_G$ of this node is $V_G = V_{DD} - V_T$ (where $V_T$ is the threshold voltage). The SL and SH nodes of the circuit are also in a "high" state (1), i.e. at $V_{DD}$ potential, and therefore the select lines (SEL) of a first decoding level are all in a "low" state ;(O); i.e. no parcel of cells of the particular block is selected.

Similarly, the $Q_0$ and $Q_1$ nodes are also in a "high" state ($V_{DD}$) and therefore they force all the inputs of all the row buffers of such a nonselected block of cells to ground potential (GND) and disable, by means of the control exerted by the inverter I on the respective $Q'_0$ and $Q'_1$ nodes, any selection through the R bus. Therefore all the row lines (wordlines) of a second decoding level are at a "high" ($V_{DD}$) level.

Within a nonselected block of cells there is not any current absorption because there is not any active current path between the two supply nodes.

A given block of cells is selected by switching the relative signal coming from the G bus to a "low" (0) level. Given that at least a wire of the P bus is active, i.e. is at a "high" (1) level, the relative circuit node G of the selected block of cells is forced to ground potential by the pass-transistor $T_p$. By virtue of a univocal first decoding level selection effected through the S bus (active "1") and the relative pass transistor $T_s$, only one select line of the first decoding level (SEL "1") is decoded, which selects a certain parcel of cells of the block, among which the specific cell addressed for reading must be identified.

Simultaneously, the two-wire Q bus preselects, through the relative pass-transistor $T_{Q0}$ or $T_{Q1}$, a section driver of a group of sixteen rows which must be enabled, by "freeing" the inputs of the relative row buffers and activating, by means of the inverter I, the network controlled by the R bus, which, through the relative pass-transistor ($T_{R0p}$ or $T_{R1p}$), completes a second-level decode operation by switching the addressed row to a "low" (0) level.

Of course, within a selected block of cells, there will be a certain current absorption because the load transistors $T_{Lq}$ and $T_{Ls}$ are used in a "static" connection in order to minimize layout encumbrance and the load on the control lines. In the preferred embodiment as presently contemplated, these transistors are planned to have a width of about 4 microns and a length of about 1 micron, but of course other dimensions may be used instead.

The decoder of the invention offers a number of advantages as compared with the decoders of the prior art. It may be implemented with a relatively reduced number of integrated components. It reduces both the load on the selection buses and the degree of "parallelism" in the row driving, i.e. permits dedication of one driver for every four wordlines of the matrix. The physical encumbrance of the decoder may be reduced because of the chips' areas remaining unoccupied by the realization of the first-level decoding circuits may be usefully exploited for realizing the second-level decoding circuitry which no longer needs to be placed, as an individual whole, in a specifically dedicated area somewhere near the memory matrix. The memory device has enhanced dynamic behavior because of a relatively smaller load on the plurality of separately selectable row drivers. Also the frequency dependent contribution to power consumption is reduced.

Figure 2:
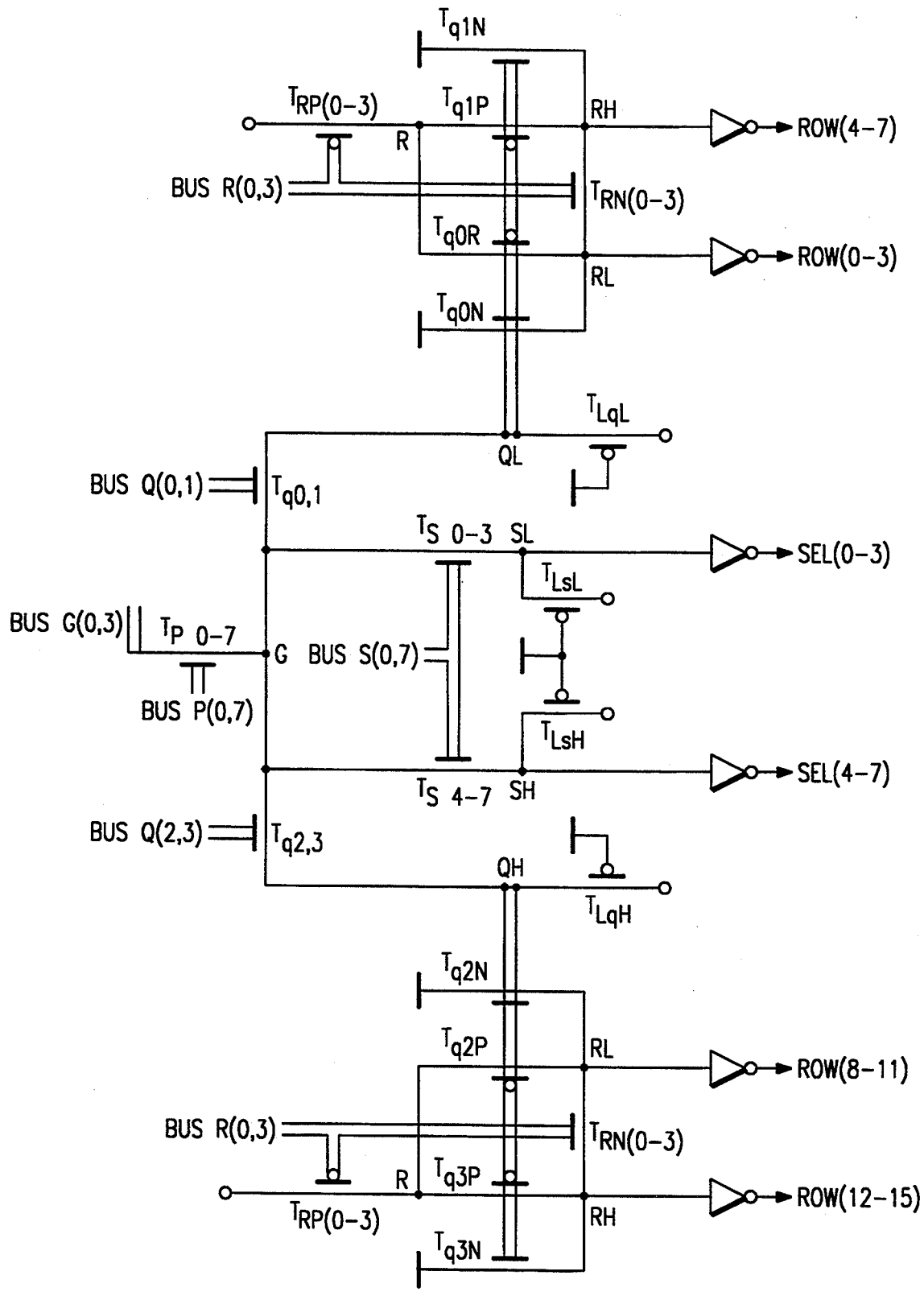
FIG. 2 is an alternative embodiment of the decoder provided by the present invention.

An alternative embodiment of the decoder of the present invention is shown in FIG. 2.

In this embodiment the control buses have the following characteristics:

| G-BUS | ACTIVE "0" (1 line) | DON'T "1" (3 lines) | STAND-BY "1" (4 lines) |
|---|---|---|---|
| P-BUS | ACTIVE "1" (1 line) | DON'T "0" (7 lines) | NO CONDITION |
| Q-BUS | ACTIVE "1" (1 line) | DON'T "0" (1 lines) | NO CONDITION |
| R-BUS | ACTIVE "0" (1 line) | DON'T "1" (7 lines) | NO CONDITION |
| S-BUS | ACTIVE "1" (1 line) | DON'T "0" (7 lines) | NO CONDITION |

As may be easily seen by comparison with FIG. 1, the block selection and the first-level decoding leading to the selection of a certain select line (SEL) is performed in the same manner, utilizing the same circuitry, as already described in connection with the embodiment of FIG. 1. Therefore, when a particular block of cells is nonselected, the relative nodes QL and QH are at a "high" level ($V_{DD}$), thus forcing all the inputs of the row buffers of the block to ground potential and therefore excluding by means of the control exerted through the transistors Tq(.)p any selection through an R bus of a second level decoding. Therefore all the row lines (wordlines) of the block are in a "high" state ($V_{DD}$).

A block of cells may be selected by switching the relative signal coming through the G bus to a "low" level (0). In view of the fact that at least a wire of the P bus is active, i.e. is at a "high" (1) level, the relative circuit node G is forced to ground potential. By means of a univocal (first decoding level) selection effected through the S bus (active "1"), an uniquely active select line of a first level decoding (SEL "1") is decoded, thus selecting a certain parcel of cells among which the specific cell addressed for reading must be identified.

Simultaneously, the two-wire Q bus selects a particular section on which a second level decoding must be carried out by freeing the inputs of the relative row buffers and activating, by means of the relative transistor Tq(.)p, the selection of the R bus, which completes a second-level decode operation by switching the addressed row to a "low" (0) level.

The advantages offered by the row decoder of FIG. 2 are substantially the same as those of the embodiment depicted in FIG. 1 with a further reduction of the number of components needed for implementing the functional circuit of the row decoder.

The column decode and sense amplifier circuitry is conventional, and therefore is not specifically shown here. The total size of the memory will of course depend on the number of columns used.

The circuitry shown in FIG. 1 can access 1 of 16 rows, 1 of 8 parcels, and 1 of $4 \times 2^8$ blocks (as selected by the G and P buses), for a total of 128K addressable rows. Of course, as will be apparent to those skilled in the art, the number of blocks, parcels per block, and rows per parcel can be readily adjusted, with appropriate change in the lines used. Moreover, the total number of bits of memory will depend on the number of columns; for example, with the use of 128 columns of cells, the circuitry of FIG. 1 can be used in a 16M ROM.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. An integrated circuit, comprising:
   a first node;
   multiple N-channel first transistors each connected in series between said first node and a respective active-low selection line;
   multiple N-channel second transistors each connected in parallel between said first node and a respective parcel-select line;
   one or more N-channel third transistors each connected between said first node and a respective second node, said second node also being connected to a respective load element which sources current thereto;
   an inverter connected from said second node to a third node;
   multiple P-channel fourth transistors each connected in parallel between said third node and a respective fourth node, each said fourth node also being connected to a load which sinks current from said fourth node.

2. The integrated circuit of claim 1, further comprising static pull-up load elements.

3. The integrated circuit of claim 1, further comprising active pull-down load elements.

4. The integrated circuit of claim 1, comprising exactly two of said third transistors for each said first node.

5. The integrated circuit of claim 1, comprising exactly eight of said second transistors for each said first node.

6. The integrated circuit of claim 1, comprising exactly sixteen of said fourth transistors for each said first node.

7. The integrated circuit of claim 1, further comprising N-channel transistor load elements each having a gate directly connected to the gate of a respectively corresponding one of said fourth transistors.

8. A CMOS decoder circuit for a NAND-type memory array, comprising:
   a virtual ground node;
   multiple first N-channel transistor each connected between said virtual ground node and a respective active-low selection line;
   one or more second N-channel transistors each connected between said virtual ground node and a respective parcel-select line;
   one or more third N-channel transistors each connected between said virtual ground node and a respective row-select subcircuit moiety, and each connected to be controlled by a respective line of said fourth bus; and
   multiple fourth P-channel transistors each operatively connected between a respective one of said third transistors and a respective one of said row-select lines; wherein multiple ones of said fourth transistors are operatively connected in parallel to each of said third transistors.

9. The integrated circuit of claim 8, further comprising static pull-up load elements.

10. The integrated circuit of claim 8, further comprising active pull-down load elements.

11. The integrated circuit of claim 8, comprising exactly two of said third transistors for each said virtual ground node.

12. The integrated circuit of claim 8, comprising exactly eight of said second transistors for each said virtual ground node.

13. The integrated circuit of claim 8, comprising exactly 16 of said fourth transistors for each said virtual ground node.

14. The integrated circuit of claim 8, further comprising N-channel transistor load elements each having a gate directly connected to the gate of a respectively corresponding one of said fourth transistors.

15. A CMOS integrated circuit, comprising:
   an array of memory cells which are NAND-connected in parcels, and which are connected to be accessed by row-select lines and pared-select lines;
   predecode logic;
   a first bus including multiple virtual ground lines, said predecode logic being connected to drive a selected one of the lines of said first bus low;
   a second bus including multiple preselect lines, said predecode logic being connected to drive a selected one of the lines of said second bus high;
   a third bus including multiple parcel-select lines, said predecode logic being connected to drive a selected one of the lines of said third bus high;
   a fourth bus including multiple quadrant-select lines, said predecode logic being connected to drive a selected one of the lines of said fourth bus high;
   a fifth bus including multiple row-select lines, said predecode logic being connected to drive a selected one of the lines of said fifth bus low;
   multiple blocks of selection logic, each including a virtual ground node;

multiple first N-channel transistors all connected in series between said virtual ground node and a respective one of the lines of said first bus, and each connected to be controlled by a respective line of said second bus;

one or more second N-channel transistors each connected between said virtual ground node and a respective parcel-select line, and each connected to be controlled by a respective line of said third bus;

one or more third N-channel transistors each connected between said virtual ground node and a respective row-select subcircuit moiety, and each connected to be controlled by a respective line of said fourth bus; and multiple fourth P-channel transistors each operatively connected between a respective one of said third transistors and a respective one of said row-select lines; wherein multiple ones of said fourth transistors are operatively connected in parallel to each of said third transistors.

16. The integrated circuit of claim 15, further comprising static pull-up load elements.

17. The integrated circuit of claim 15, comprising exactly two of said third transistors for each said virtual ground node.

18. The integrated circuit of claim 15, comprising exactly eight of said second transistors for each said virtual ground node.

19. The integrated circuit of claim 15, comprising exactly 16 of said fourth transistors for each said virtual ground node.

20. The integrated circuit of claim 15, further comprising N-channel transistor load elements each having a gate directly connected to the gate of a respectively corresponding one of said fourth transistors.

* * * * *